United States Patent [19]

Flatley et al.

[11] Patent Number: 4,637,836

[45] Date of Patent: Jan. 20, 1987

[54] PROFILE CONTROL OF BORON IMPLANT

[75] Inventors: Doris W. Flatley, Hillsboro Township, Somerset County; Sheng T. Hsu, W. Windsor Township, Mercer County, both of N.J.

[73] Assignee: RCA Corporation, Princeton, N.J.

[21] Appl. No.: 778,986

[22] Filed: Sep. 23, 1985

[51] Int. Cl.[4] .................... H01L 21/265; H01L 21/26
[52] U.S. Cl. ..................................... 148/1.5; 148/187; 29/571; 29/576 B; 29/576 T; 357/91
[58] Field of Search ............... 148/1.5, 187; 29/576 B, 29/576 T, 571; 357/91

[56] References Cited

U.S. PATENT DOCUMENTS

| | | | |
|---|---|---|---|
| 3,390,019 | 6/1968 | Manchester | 148/1.5 |
| 4,435,896 | 3/1984 | Parrillo et al. | 29/571 |
| 4,502,894 | 3/1985 | Seto et al. | 148/1.5 |
| 4,507,847 | 4/1985 | Sullivan | 29/576 B |
| 4,560,419 | 12/1985 | Bourassa et al. | 148/1.5 |
| 4,569,123 | 2/1986 | Ishii et al. | 29/578 |

Primary Examiner—Upendra Roy
Attorney, Agent, or Firm—Birgit E. Morris; R. Hain Swope

[57] ABSTRACT

The ion implantation of a silicon structure isolated from a semiconductor substrate by a layer of silicon dioxide with boron ions to render it p type conductive is improved by initially doping the silicon with phosphorus ions. The presence of the phosphorus ions in the silicon prevents the implanted boron ions from rapidly migrating into the silicon dioxide during annealing.

7 Claims, 7 Drawing Figures

PROFILE CONTROL OF BORON IMPLANT

This invention relates to a method of controlling or confining boron ion implantation in semiconductor processing.

BACKGROUND OF THE INVENTION

The ion implantation of silicon with boron ions to create an area of positive charge is commonplace in the semiconductor industry. It is recognized that boron will rapidly migrate from silicon to the adjacent surface of silicon dioxide and subsequently diffuse into the silicon dioxide. In certain design situations, i.e. where the silicon to be doped with boron by ion implantation overlies an isolation dielectric layer of silicon dioxide, this seeming affinity of a boron ion implant for silicon dioxide can be a decided disadvantage. If the silicon structure is doped with a relatively large dose of boron ions, the boron will rapidly diffuse into the oxide layer upon heating to render the implant substitutional and, from there, will diffuse into adjacent surfaces, for example, into an underlying single crystalline silicon substrate. This substantial movement of boron ions into the isolation dielectric layer and, to a lesser degree, into the substrate can be very detrimental to the operation of any device incorporating it. A solution to this problem is provided in accordance with this invention.

BRIEF SUMMARY OF THE INVENTION

A layer of silicon isolated from a substrate by a layer of silicon dioxide is sequentially ion implanted with a low dose of phosphorus ions and a high dose of boron ions to make the silicon layer p type conductive. The phosphorus implant prevents the substantial diffusion of boron ions from the silicon into the silicon dioxide isolating layer and, thereafter, and to a lesser degree, from the oxide into adjacent areas of the substrate.

DETAILED DESCRIPTION OF THE INVENTION

Figure 1:
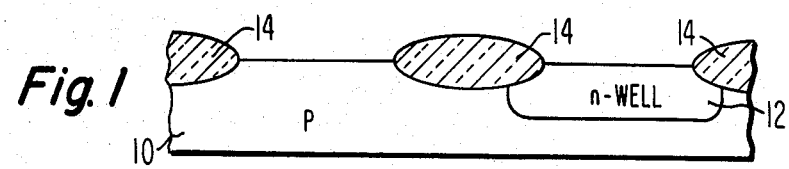
FIGS. 1-7 are cross-sectional views illustrating the steps of a semiconductor process which is improved in accordance with this invention.

The present invention is directed to the formation of conductive structures such as lines, interconnects, gates and the like on a semiconductor substrate. In particular, the present invention pertains to the formation of such conductive structures by the ion implantation of a silicon layer with boron ions to render it p type conductive. The term "silicon layer" as utilized herein denotes a layer of silicon which covers the entire substrate or only a portion thereof, i.e. a patterned layer.

The silicon layer rendered conductive in accordance with this invention may be deposited onto the substrate by any conventional technique, suitably by low pressure chemical vapor deposition (LPCVD) or a similar process. Such a silicon layer is suitably from about 300 nm to about 700 nm, preferably from about 400 nm to about 550 nm, thick. The silicon layer may be deposited in the amorphous or the polycrystalline state, preferably the former, and may be patterned before, between or after the two doping operations of the subject process.

The subject process is of significant advantage wherein the silicon structure to be doped with boron ions is isolated from the underlying substrate, typically single crystalline silicon, by an isolation layer of silicon dioxide, commonly termed "gate oxide". This is because of the recognized tendency for implanted boron ions to rapidly migrate from a silicon layer to the adjacent surface of a silicon dioxide layer and, subsequently, diffuse in the oxide layer in large quantity. We have found that, if the silicon structure is initially implanted with a low dosage of phosphorus ions, the boron ions will be retained therein and will not diffuse into the oxide layer. Although the mechanism responsible for this phenomenon is not known with certainty, it is believed that the phosphorus ions block the grain boundaries and prevent the smaller boron ions from diffusing out of the silicon.

The initial doping of the silicon structure is preferably carried out by ion implantation. However, the silicon layer may be doped in-situ as it is deposited, for example, by adding a source of phosphorus, e.g. phosphine, to an LPCVD deposition mixture. The silicon layer may also be doped by diffusion using conventional techniques, e.g. heating to elevated temperatures, i.e. 900°-1100° C., in the presence of a source of phosphorus such as phosphorus oxychloride. Ion implantation is preferred since having a peak of phosphorus ions at a given depth appears to be a more effective barrier than an uniform distibution throughout the silicon structure. The implant dosage of phosphorus ions is less than about $10_{15}$ ions per square centimeter, suitably from about $10^{12}$ to about $10^{15}$, and preferably from about $10^{13}$ to about $10^{14}$, ions per square centimeter at from about 120 to 160, preferably about 140, KeV. The implant may then be annealed, if desired, by heating to a temperature of from about 800° to 1000° C., suitably about 850° C.

The silicon structure is then implanted with boron in a dosage of at least about $10^{15}$ ions per square centimeter, suitably from about $10^{15}$ to $10^{16}$, and preferably about $4 \times 10^{15}$, ions per square centimeter at an implant energy of from about 30 to 40, suitably about 35, KeV. It will be appreciated, of course, that the dosage of the boron implant must be sufficiently greater than that of the phosphorus implant so that the silicon structure is made p type conductive, preferably sufficient to make the silicon structure p+ conductive. The boron implant is then annealed, suitably at a temperature of from about 800° to 1000° C., preferably at about 900° C. The silicon structure can thus be made p+ conductive without having the implanted boron ions diffuse into the insulating oxide layer and the underlying substrate.

A process which significantly benefits from the present invention involves the formation of n and p type channels in a wafer as applicable, for example, to the manufacture of MOSFETs. A typical process is illustrated in the drawings. In FIG. 1, the starting substrate is a p type silicon wafer 10 which has been lightly implanted with a suitable impurity to form n type well 12. For example, with the surface of the wafer 10 lithographically masked, the wafer is ion implanted with a dosage of $10^{12}$ ions/cm$^2$ of phosphorus ions and then heated to about 1200° C. to drive in the implant. Thereafter, using a suitable mask, the surface of the wafer 10 is locally oxidized to form thick field oxide deposits 14.

Figure 2:
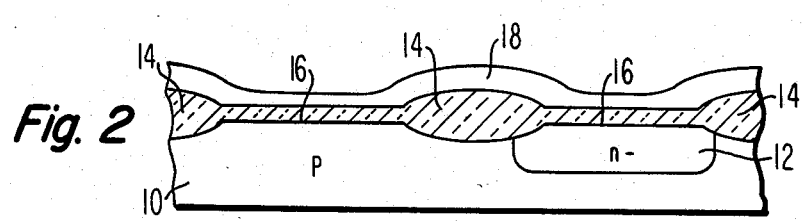
Figure 3:
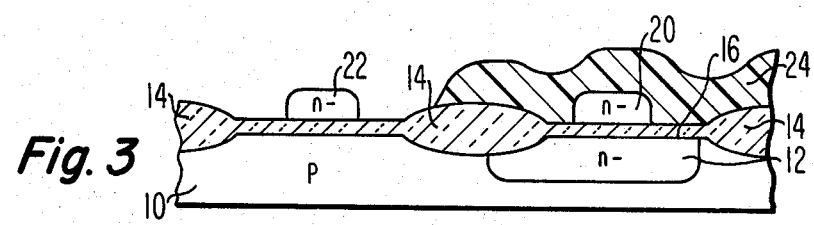
Figure 4:
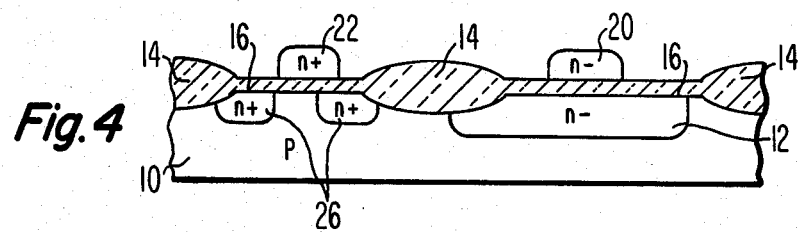

As shown in FIG. 2, a thin layer of high purity gate oxide 16 is then grown over the structure utilizing conventional techniques, suitably by oxidizing in steam at about 800° C. A layer of silicon 18 is then formed over the structure, suitably in the amorphous state by LPCVD from silane at 560° C. This silicon layer 18 is ion implanted with a light dosage, e.g. $10^{13}$ ions/cm$^2$, of phosphorus and photolithographically defined to form the isolated gate structures 20 and 22, both of which are n doped, as shown in FIG. 3. These structures may be of any configuration, e.g. islands, lines and the like. A photoresist layer 24 is formed over the structure and patterned to mask the n— well 12 as shown in FIG. 3. The structure is again ion implanted with phosphorus to form source and drain implants 26 in the substrate 10 as shown in FIG. 4. The implant dosage of phosphorus ion is sufficient so that the source and drain implants 26 and the gate structure 22 are all n+ conductive. The structure is again photolithographically masked to expose only the surface overlying the n— well 12 and ion implanted with an appropriate dosage of boron ions so that the silicon structure 20 is rendered p+ and the p+ source and drain implants 28 are formed as shown in FIG. 5.

The above-described ion implantation steps may be carried out in any sequence so long as the silicon structure 20 is implanted with a light dose of phosphorus ions preceding the boron ion implantation. For example, the substrate may be photolithographically masked to expose only silicon structure 20 which is lightly implanted with phosphorus. Additional resist is then removed exposing the surface overlying the n— well 12 and the boron ion implantation is carried out. The resist is removed, a new patterned layer of resist is formed on the structure surface and the exposed areas ion implanted to dope the silicon gate structure 22 and form the source and drain implants 26.

Figure 5:
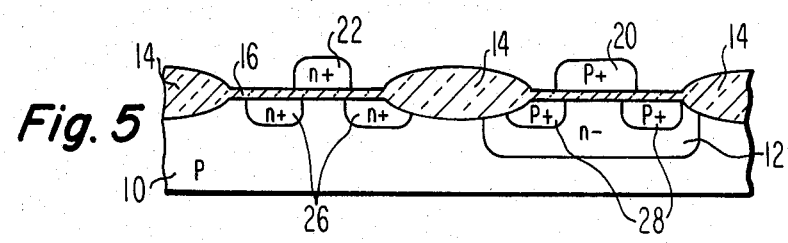

In the conventional manufacture of a MOSFET such as shown in FIG. 5, the phosphorus and the boron implants are formed in either order. In the case of the boron implant, however, when the implant is heated to make it substitutional, the boron ions diffuse into the gate oxide 16 and from these some will diffuse into the underlying wafer substrate 10. Because the boron ions do not penetrate readily into the wafer, which is typically single crystalline silicon, they tend to accumulate at the oxide/wafer interface. In the device illustrated in FIG. 5, the severe drain of boron ions from the silicon gate 20 which would result from the conventional boron ion implantation thereof would cause a significant shift in the voltage of the device and cause the threshold voltage of the device to drop sharply, thus making the device substantially less efficient.

Figure 6:
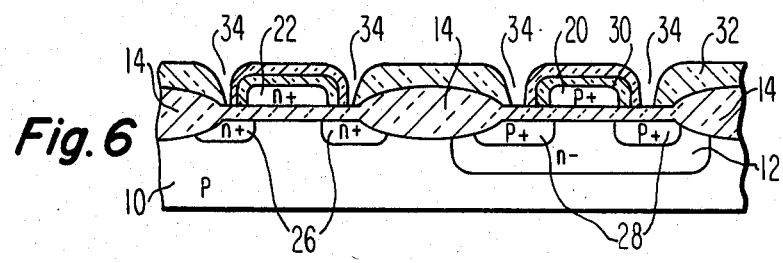
Figure 7:
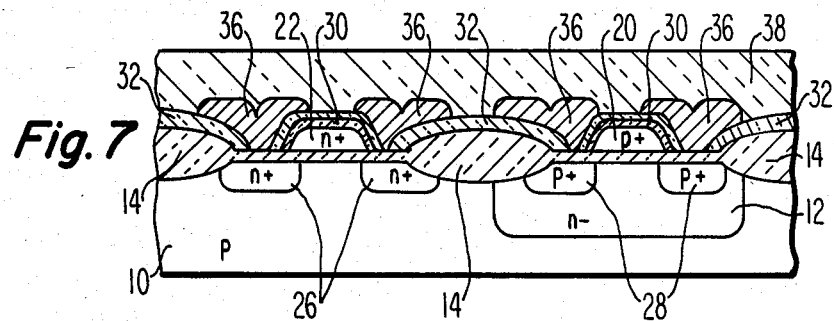

The structure illustrated in FIG. 5 may be treated in any conventional manner to form a finished device. For example, as shown in FIG. 6, a layer of oxide 30 may be grown over the silicon gates 20 and 22 and a layer of reflow glass 32, such as borophosphosilicate glass, deposited thereover. The glass layer 32 is heated to planarize the surface and photolithographically defined to form openings 34 over the source and drain regions 26 and 28,. The glass is then heated to soften the edges of the openings 34 making them smooth as shown in FIG. 6. A second conducting layer 36, consisting of a suitable metal or doped silicon, is then deposited and patterned and a final sealing top layer 38 is added to form the device illustrated in FIG. 7.

The advantage of the subject process is appreciated when it is considered that, in a similar device formed without the added phosphorus doping step, the concentration of boron ions at the silicon/silicon dioxide interface is more than an order of magnitude higher than that in a device produced according to this invention. The concentration of boron ions in the gate oxide of the conventionally formed device is up to ten times that in the isolated silicon structure and the threshold voltage, which is typically about minus one volt, may actually be shifted to a plus voltage.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

A group of eight single-crystal silicon wafers of <100> orientation were oxidized at 900° in steam to form a layer of silicon dioxide 100 nm thick on the surface of each. The wafers were placed in a LPCVD reactor and a layer of amorphous silicon 500 nm thick was deposited on each from silane at 560°, 350 mtorr and a 200 cm$^3$/min silane flow.

The silicon layer was ion implanted with phosphorus ions at 120 KeV, half receiving $10^{14}$ ions/cm$^2$ and the remainder $2\times 10^{15}$ ions/cm$^2$. The silicon layer was thereafter implanted with boron ions at 40 KeV at a dosage of $4\times 10^{15}$ and $8\times 10^{15}$ ions/cm$^2$, respectively. The samples were oxidized in dry oxygen at 900° for 30 minutes.

Secondary ion mass spectroscopy (SIMS) analysis of two of the wafers receiving the larger boron implant showed a boron ion concentration at a depth of about 425 nm of about $1.5\times 10^{19}$ ions/cm$^3$. In contrast, the boron ion concentration of two wafers indentically processed except that they did not receive an initial phosphorus ion implant was $1.25\times 10^{20}$ at a depth of 450 nm, a difference of an order of magnitude.

The oxide layer was stripped from the remaining wafers, capacitors were formed and tested. There was no difference among the wafers which indicates that the boron ions did not penetrate the oxide layer. The advantage of the process of this invention is demonstrated by these results.

We claim:

1. In a process of ion implanting a silicon structure having a thickness of from about 300 nm to about 700 nm overlying a layer of silicon dioxide with a dosage of boron ions of at least about $10^{15}$ ions per square centimeter thereby rendering the structure p type conductive and annealing said implant, the improvement which comprises doping said structure prior to the boron implant with sufficient phosphorus ions to substantially prevent the migration of the boron ions into the silicon dioxide layer during annealing.

2. A process in accordance with claim 1, wherein the silicon structure is doped with phosphorus ions in-situ as it is deposited onto the silicon dioxide layer.

3. A process in accordance with claim 1, wherein the silicon structure is doped with phosphorus ions by diffusion.

4. A process in accordance with claim 1, wherein the silicon structure is doped with phosphorus ions by ion implantation.

5. A process in accordance with claim 1, wherein the implant dosage of boron ions is from about $10^{15}$ to about $10^{16}$ ions per square centimeter.

6. A process in accordance with claim 4, wherein the implant dosage of phosphorus ions is from about $10^{12}$ to about $10^{15}$ ions per square centimeter.

7. A process in accordance with claim 6, wherein the implant dosage of phosphorus ions is from about $10^{13}$ to about $10^{14}$ ions per square centimeter.

* * * * *